(12) United States Patent  
Hagiwara

(10) Patent No.: US 9,847,226 B2  
(45) Date of Patent: Dec. 19, 2017

(54) MANUFACTURING METHOD OF SEMICONDUCTOR DEVICE

(71) Applicant: RENESAS ELECTRONICS CORPORATION, Tokyo (JP)

(72) Inventor: Takuya Hagiwara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/451,525

(22) Filed: Mar. 7, 2017

(65) Prior Publication Data

US 2017/0178897 A1 Jun. 22, 2017

Related U.S. Application Data

(63) Continuation of application No. 15/137,964, filed on Apr. 25, 2016, now Pat. No. 9,627,203.

(30) Foreign Application Priority Data

May 14, 2015 (JP) ................................. 2015-099065

(51) Int. Cl.
*H01L 21/00* (2006.01)
*H01L 21/027* (2006.01)
(Continued)

(52) U.S. Cl.
CPC ........ *H01L 21/0274* (2013.01); *G03F 7/0392* (2013.01); *G03F 7/094* (2013.01);
(Continued)

(58) Field of Classification Search
None
See application file for complete search history.

(56) References Cited

U.S. PATENT DOCUMENTS 7,050,146 B2   5/2006 Duineveld et al.
7,196,770 B2   3/2007 Baselmans et al.
(Continued)

FOREIGN PATENT DOCUMENTS

JP    2006-108564 A    4/2006
JP    2006-528835 A    12/2006
(Continued)

*Primary Examiner* — Evren Seven
(74) *Attorney, Agent, or Firm* — McDermott Will & Emery LLP

(57) ABSTRACT

The reliability of a semiconductor device is improved. In a manufacturing method, a film to be processed is formed over a circular semiconductor substrate, and a resist layer whose surface has a water-repellent property is formed thereover. Subsequently, the water-repellent property of the resist layer in the outer peripheral region of the circular semiconductor substrate is lowered by selectively performing first wafer edge exposure on the outer peripheral region of the semiconductor substrate, and then liquid immersion exposure is performed on the resist layer. Subsequently, second wafer edge exposure is performed on the outer peripheral region of the circular semiconductor substrate, and then the resist layer, on which the first wafer edge exposure, the liquid immersion exposure, and the second wafer edge exposure have been performed, is developed, so that the film to be processed is etched by using the developed resist layer.

8 Claims, 9 Drawing Sheets

(51) Int. Cl.
  *H01L 21/311* (2006.01)
  *H01L 21/308* (2006.01)
  *H01L 21/3105* (2006.01)
  *H01L 21/02* (2006.01)
  *H01L 21/28* (2006.01)
  *H01L 21/762* (2006.01)
  *H01L 29/66* (2006.01)
  *G03F 7/20* (2006.01)
  *G03F 7/09* (2006.01)
  *G03F 7/16* (2006.01)
  *G03F 7/039* (2006.01)
  *G03F 7/38* (2006.01)
  *G03F 7/32* (2006.01)

(52) U.S. Cl.
  CPC .............. *G03F 7/162* (2013.01); *G03F 7/168* (2013.01); *G03F 7/2022* (2013.01); *G03F 7/2041* (2013.01); *G03F 7/327* (2013.01); *G03F 7/38* (2013.01); *H01L 21/0217* (2013.01); *H01L 21/02164* (2013.01); *H01L 21/28017* (2013.01); *H01L 21/3081* (2013.01); *H01L 21/3086* (2013.01); *H01L 21/31055* (2013.01); *H01L 21/31116* (2013.01); *H01L 21/31144* (2013.01); *H01L 21/76224* (2013.01); *H01L 29/66568* (2013.01)

(56) References Cited

U.S. PATENT DOCUMENTS

| | | |
|---|---|---|
| 8,795,556 B2 | 8/2014 | Lin |
| 2004/0152323 A1* | 8/2004 | Suzuki ................. B82Y 10/00 430/311 |
| 2005/0221234 A1 | 10/2005 | Ito |
| 2007/0132969 A1 | 6/2007 | Gellrich et al. |
| 2008/0107999 A1 | 5/2008 | Nakano |
| 2008/0135207 A1 | 6/2008 | Fukuoka et al. |
| 2009/0053651 A1* | 2/2009 | Hatakeyama ......... G03F 7/0035 430/285.1 |
| 2009/0107519 A1 | 4/2009 | Ishikawa et al. |
| 2010/0119960 A1 | 5/2010 | Fonseca et al. |
| 2010/0195066 A1 | 8/2010 | Kim et al. |
| 2011/0294069 A1 | 12/2011 | Bae et al. |
| 2012/0045721 A1 | 2/2012 | Printz et al. |

FOREIGN PATENT DOCUMENTS

| | | |
|---|---|---|
| JP | 2008-235542 A | 10/2008 |
| JP | 2009-088552 A | 4/2009 |
| JP | 2009-117873 A | 5/2009 |

* cited by examiner

MANUFACTURING METHOD OF SEMICONDUCTOR DEVICE

CROSS-REFERENCE TO RELATED APPLICATIONS

This application is a continuation of U.S. patent application Ser. No. 15/137,964 filed Apr. 25, 2016, which is based upon and claims the benefit of priority from Japanese Patent Application No. 2015-099065 filed on May 14, 2015 including the specification, drawings and abstract is incorporated herein by reference in its entirety.

BACKGROUND

The present invention relates to a manufacturing method of a semiconductor device, and in particular, to a technique effective when applied to a manufacturing method of a semiconductor device using liquid immersion exposure.

The liquid immersion exposure is an exposure system in which in a minute gap between a lens and a semiconductor wafer, a water film (meniscus) is formed with the use of the surface tension of water, whereby the minute gap between the lens and a surface to be irradiated (semiconductor wafer) is caused to have a high refractive index, which makes it possible to increase the effective numerical aperture (NA) of the lens to a higher level than normal dry exposure. Because a finer pattern can be resolved by increasing the NA of a lens, the liquid immersion exposure is being put to industrially practical use.

Japanese Unexamined Patent Application Publication No. 2006-108564 (Patent Document 1) describes a technique in which, in order to make the surface layer of a resist film hydrophilic, an oxide layer is formed over the surface layer of the resist film by irradiating the resist film with vacuum ultraviolet light while a silicon substrate is being exposed to an active oxygen atmosphere.

Japanese Unexamined Patent Application Publication No. 2008-235542 (Patent Document 2) describes a technique in which, in liquid immersion lithography, exposure processing can be performed while a liquid is being prevented from flowing outside a wafer even when an area near to the outer periphery of the wafer is exposed. Specifically, a liquid repellent agent layer is provided over the outer peripheral end surface of the wafer and the peripheral portion of the end surface.

Japanese Unexamined Patent Application Publication No. 2009-117873 (Patent Document 3) describes a technique in which a substrate is wetted in advance by supplying a pre-wetting liquid before liquid immersion exposure, so that an immersion liquid is supplied between the wetted substrate and a projection system.

Japanese Unexamined Patent Application Publication (Translation of PCT Application) No. 2006-528835 (Patent Document 4) describes a technique with respect to an immersion scanner provided with a means for preventing a gas bubble from appearing in an immersion liquid and for removing a gas bubble.

Japanese Unexamined Patent Application Publication No. 2009-88552 (Patent Document 5) describes a technique with respect to a lithography apparatus in which an influence of a bubble in an immersion liquid, which may affect the imaging quality of immersion lithography, is reduced.

RELATED ART DOCUMENT

Patent Document

[Patent Document 1] Japanese Unexamined Patent Application Publication No. 2006-108564

[Patent Document 2] Japanese Unexamined Patent Application Publication No. 2008-235542

[Patent Document 3] Japanese Unexamined Patent Application Publication No. 2009-117873

[Patent Document 4] Japanese Unexamined Patent Application Publication (Translation of PCT Application) No. 2006-528835

[Patent Document 5] Japanese Unexamined Patent Application Publication No. 2009-88552

SUMMARY

According to the study by the present inventors, the following fact has been known.

In liquid immersion exposure, a top-coatless resist having a high water-repellent property is used to reduce the processing time of one semiconductor wafer; however, it has been found that, because of the high water-repellent property, a pattern defect is caused in the peripheral portion of the semiconductor wafer, thereby decreasing the reliability of a semiconductor device formed over the semiconductor wafer. Accordingly, in a manufacturing method of a semiconductor device using liquid immersion exposure, there is a need for a technique for improving the reliability of a semiconductor device.

Other problems and new characteristics will become clear from the description and accompanying drawings of the present specification.

According to one embodiment, a film to be processed is formed over a circular semiconductor substrate, so that a resist layer whose surface is water repellent is formed over the film to be processed. Subsequently, the water-repellent property of the resist layer in the outer peripheral region of the semiconductor substrate is lowered by selectively performing first wafer edge exposure on the outer peripheral region of the circular semiconductor substrate, and then liquid immersion exposure is performed on the resist layer. Subsequently, second wafer edge exposure is performed on the outer peripheral region of the circular semiconductor substrate, and then the resist layer, on which the first wafer edge exposure, the liquid immersion exposure, and the second wafer edge exposure have been performed, is developed, so that the film to be processed is etched by using the developed resist layer.

According to the one embodiment, the reliability of a semiconductor device can be improved.

DETAILED DESCRIPTION

Figure 1:
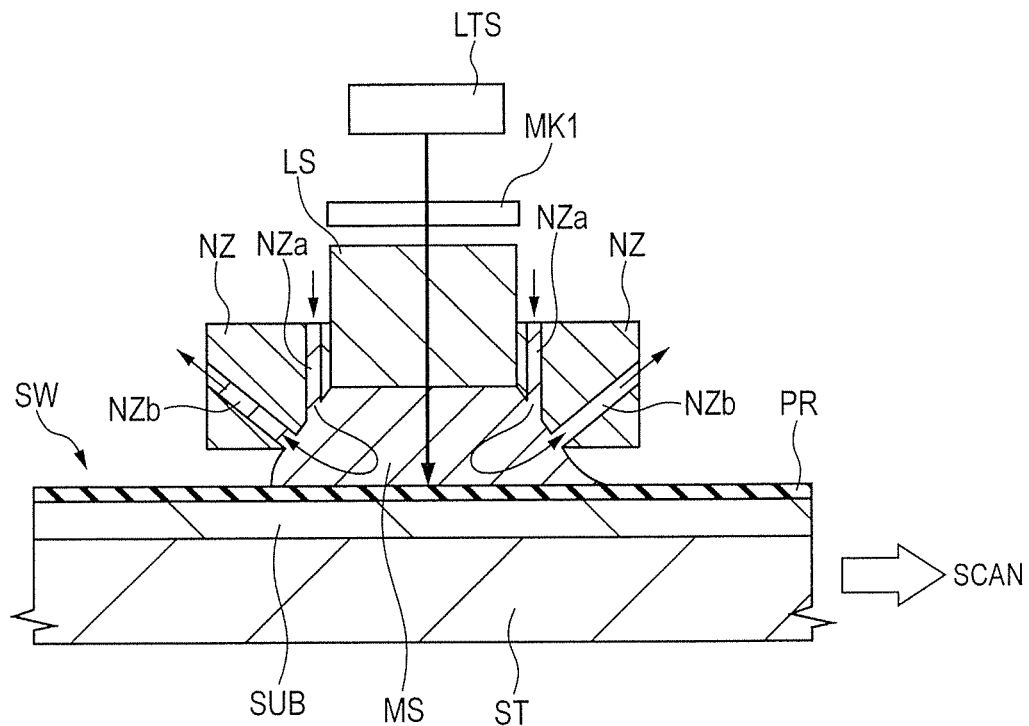
FIG. 1 is a view for explaining liquid immersion exposure.

When necessary for convenience in the following embodiment, description is given by dividing the embodiment into a plurality of sections or embodiments; however, unless otherwise indicated, they are not independent of one another, but one is related with the other part or the whole as a modification, a detail, supplementary description, etc. In addition, in the following embodiments, when referred to the number of elements, etc. (number of units, numerical value, quantity, range, etc., are included), unless stated explicitly or except when the number is obviously limited to specific numbers in principle, the number is not limited to the specific ones but may be more or less than the specific numbers. Further, in the following embodiments, it is needless to say that components (also including constituent steps, etc.) are not necessarily requisite unless stated explicitly or except when they are obviously requisite in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. This also applies to the aforementioned numerical values and ranges.

Hereinafter, preferred embodiments of the present invention will be described in detail based on the accompanying drawings. In each view for explaining the embodiments, components having the same function will be denoted with the same reference numerals, and duplicative description thereof will be omitted. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

It will first be described how the study by the present inventors has reached the present invention.

FIG. 1 is a view for explaining liquid immersion exposure.

An apparatus having a structure as illustrated, for example, in FIG. 1 is used in the liquid immersion exposure.

In the immersion scanner of FIG. 1, a light source LTS and a photomask (reticle) MK1 are arranged above a lens (projection lens) LS, and a semiconductor wafer SW is arranged under the lens LS so as to be arranged (vacuum-adsorbed) and held over a wafer stage ST. Then, deionized water enters an inlet port NZa of a nozzle NZ and is discharged from a suction port NZb such that a gap between the lens LS and the surface to be irradiated (surface to be exposed) of the semiconductor wafer SW is filled with deionized water. With the deionized water, a meniscus (water film) is formed in the minute gap between the lens LS and the surface to be irradiated of the semiconductor wafer SW. The meniscus functions as an immersion liquid MS, but it is said that the surface to be irradiated of the semiconductor wafer SW should be water repellent because of the meniscus formation. A resist layer (a resist film, a photoresist layer, or a photosensitive resist layer) PR for microfabrication is formed as a single-layer resist film or a multi-layer resist film over the surface to be irradiated of the semiconductor wafer SW. The semiconductor wafer SW has a semiconductor substrate SUB and the resist layer PR. The light source LTS is, for example, an ArF excimer laser having a wavelength of 193 nm. The photomask MK1 is a mask for printing a desired pattern over the resist layer PR, and is formed of glass or quartz.

A reduced projection pattern, which is almost the same as the pattern the photomask MK1 has, is printed over the resist layer PR with the light emitted from the light source LTS reaching the semiconductor wafer SW via the photomask MK1, the lens LS, and the immersion liquid MS.

In the liquid immersion exposure (liquid immersion lithography), scanning exposure is performed, in which the semiconductor wafer SW (in other words, the resist layer PR) is irradiated with exposure light (ArF excimer laser light) by scanning the semiconductor wafer SW with respect to the lens LS. In this case, the resist layer PR is required to be highly water repellent in order to make it possible that the immersion liquid moves at high speed, smoothly, and without leaving a drop of water. If the water-repellent property of the resist layer PR is low, there is the concern that a drop of water of the immersion liquid MS (immersion water) maybe left when the semiconductor wafer SW is scanned. If a drop of water is left, it eliminates heat of vaporization from the semiconductor wafer SW when it is dried, and accordingly the semiconductor wafer SW contracts, thereby causing misalignment in superposition between the photomask MK1 and the semiconductor wafer SW.

A top-coatless resist is used as the resist layer PR having a high water-repellent property. A high water-repellent property can be achieved when the top-coatless resist is coated once, because a trace amount of a polymer having low surface free energy (fluorine-containing polymer) is mixed as a water repellent into a resist liquid and the water repellents are concentrated only in the surface, when a coated film is formed, by using the surface segregation effect of the water repellent.

In this case, however, it has been found from the study by the present inventors that there are the following problems.

Figure 2:
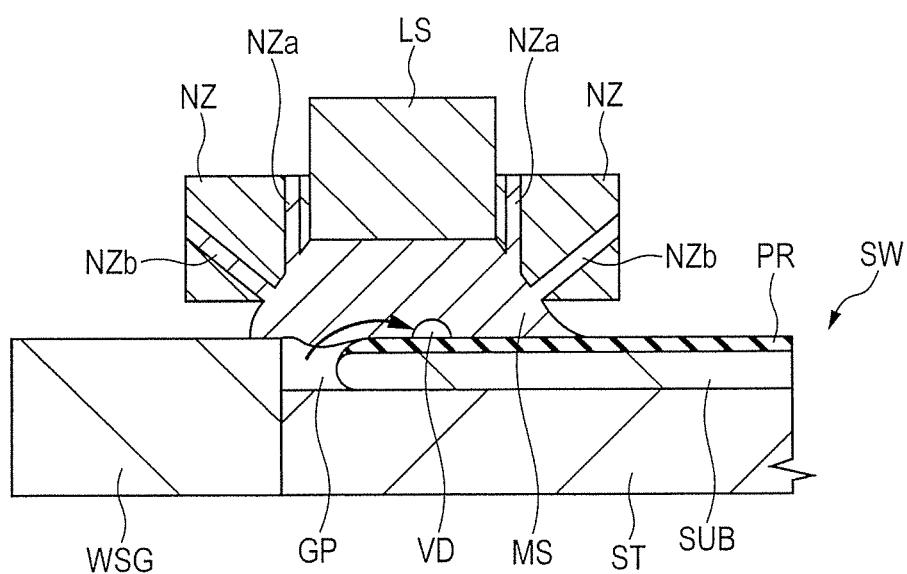
FIG. 2 is a view for explaining engulfment of a bubble in liquid immersion exposure.

FIG. 2 is a view for explaining engulfment of a bubble in the liquid immersion exposure.

In the immersion scanner, a wafer stage guide WSG is arranged around the semiconductor wafer SW so as to surround the entire circumference of the semiconductor wafer SW. The wafer stage guide WSG has a height almost equal to that of the main surface of the semiconductor wafer SW over which the resist layer PR has been formed, and there is a gap GP having a width of approximately several millimeters between the semiconductor wafer SW and the wafer stage guide WSG. Further, a mechanism is adopted, in which the wafer stage guide WSG moves integrally with the wafer stage ST when the semiconductor wafer SW is scanned.

The wafer stage guide WSG is provided in order to prevent the immersion liquid MS from spilling and falling from the surface of the semiconductor wafer SW, and the surface thereof is coated, for example, with a fluorine-based resin, or the like, in order to provide a water-repellent property. Because each of the resist layer PR formed over the surface of the semiconductor wafer SW and the wafer stage guide WSG has a high water-repellent property, the immersion liquid MS never spills and falls in the gap GP even when the immersion liquid MS lies across the surface of the semiconductor wafer SW, the gap GP, and the wafer stage guide WSG. In other words, the resist layer PR is required to be water repellent also in order to hold the immersion liquid MS over the surface of the semiconductor wafer SW.

According to the study by the present inventors, however, it has been known that a defect is caused when a top-coatless resist having a high water-repellent property is used as the resist layer PR due to high-speed processing in the liquid immersion exposure. When the semiconductor wafer SW moves from a state, in which the immersion liquid MS lies across the surface of the semiconductor wafer SW, the gap GP, and the wafer stage guide WSG, to the outside direction of the semiconductor wafer SW with respect to the lens LS, the air present in the gap GP is engulfed into the immersion liquid MS, thereby causing a bubble VD in the immersion liquid MS, as illustrated in FIG. 2. The bubble VD having a diameter of approximately several millimeters is caused in the outer periphery of the main surface of the semiconductor wafer SW, and in the area where the bubble VD has been caused, a pattern is not resolved, thereby causing a pattern defect. It has been found that, that is, a pattern defect is caused because the pattern is defocused when the light path of the exposure light is disturbed by the bubble VD. It has also been known that, as the water-repellent property of the resist layer PR is higher, the bubble VD is more likely to be caused.

It has been known that, when a semiconductor device is thus manufactured by the liquid immersion exposure using a top-coatless resist, there are problems in which the reliability of the semiconductor device maybe decreased, the manufacturing yield thereof may be decreased, and the like. In the following embodiment, innovations for overcoming these problems are made, the innovations being characterized by the fact that the water-repellent property of a resist film is controlled in the peripheral region of a semiconductor wafer before liquid immersion exposure.

(Embodiment)

A semiconductor device according to the present embodiment has a plurality of MISFETs (Metal Insulator Semiconductor Field Effect Transistors). The semiconductor device is formed in a chip region of a rectangular shape, and a plurality of the chip regions are arranged in a matrix pattern in a semiconductor wafer. A plurality of the semiconductor devices are formed over one semiconductor wafer.

Figure 3:
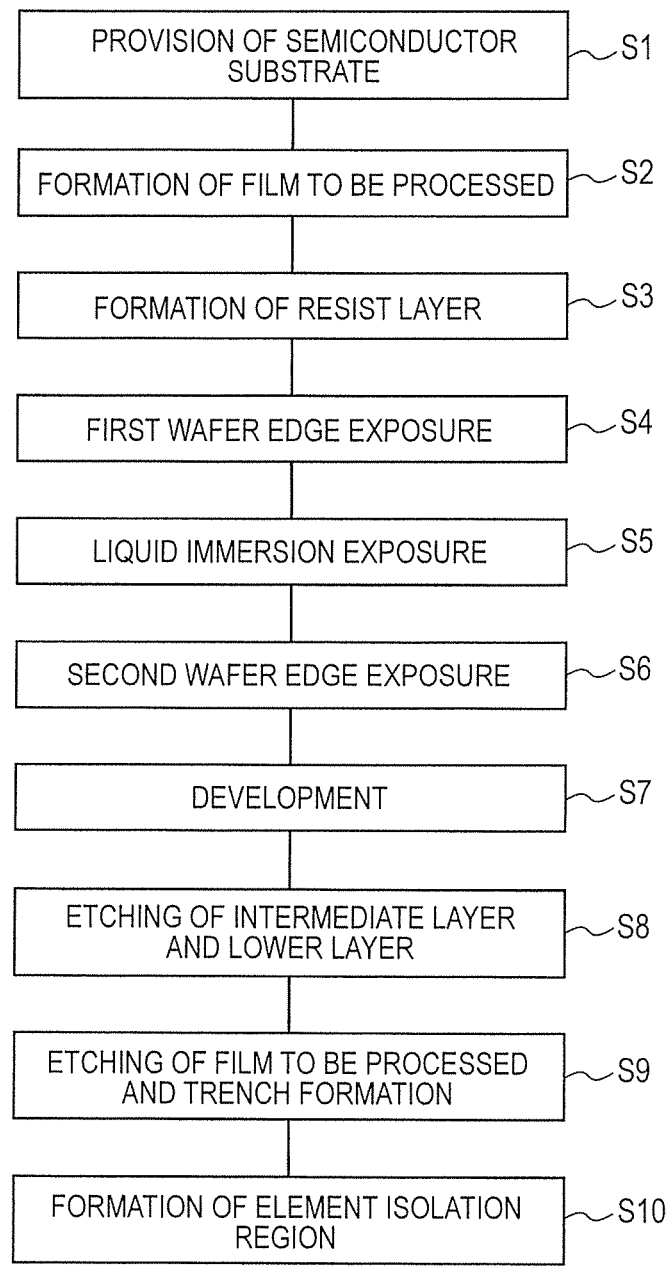
FIG. 3 is a process flow view illustrating part of a process flow of a semiconductor device.

FIG. 3 is a process flow view illustrating part of a process flow of the semiconductor device, and FIGS. 4 to 14 are essential-part sectional views each illustrating a manufacturing step of a semiconductor device. FIG. 15 is a plan view of the semiconductor wafer, illustrating an exposure region.

Figure 4:
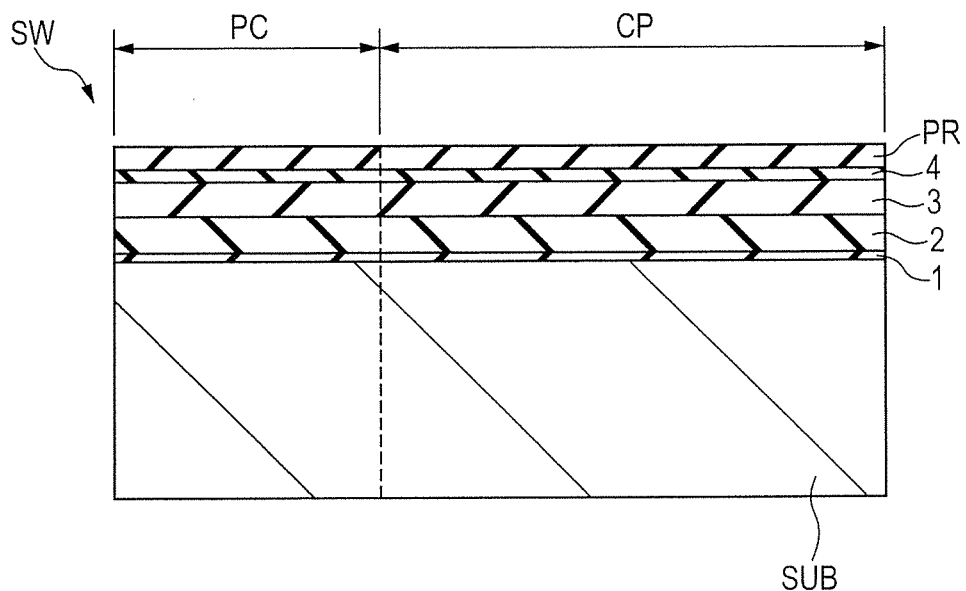
FIG. 4 is an essential-part sectional view illustrating a manufacturing step of a semiconductor device.

As illustrated in FIG. 4, a semiconductor substrate SUB including, for example, silicon is first provided (Step S1 in FIG. 3.) The semiconductor substrate SUB is the semiconductor wafer SW whose planar shape is circular (approximately circular). FIG. 4 illustrates part of each of a peripheral portion PC and a central portion CP of the semiconductor wafer SW. The peripheral portion PC includes at least the later-described first wafer edge exposure region WEE1 and second wafer edge exposure region WEE2. The central portion CP means a central portion (inner portion) of the semiconductor wafer SW, the central portion being located inside the peripheral portion PC. The sectional shape of the outer periphery of the semiconductor wafer SW is briefly illustrated as a rectangular shape, but actually the corners on the main surface side and the rear surface side of the semiconductor wafer SW are chamfered in the thickness direction, as illustrated in FIG. 2.

Subsequently, a film to be processed (layer to be processed) 2 is formed over the semiconductor substrate SUB via an insulating film 1 including, for example, a silicon oxide film (Step S2 in FIG. 3.) The film to be processed 2 includes, for example, a silicon nitride film. Subsequently, an antireflection film is formed over the film to be processed 2. A BARL (Bottom Antireflective Layer) using an inorganic film or a BARC (Bottom Antireflective Coating) using an organic film is used as the antireflection film. The BARC is formed by using coating and thermal curing. When light is imaged by using light having a large incident angle, a tri-layer resist process may be adopted, in which a Bottom layer 3 and a middle layer 4 are used as the antireflection film. In the tri-layer resist process, the middle layer 4 functions as a mask for processing the bottom layer 3 while the bottom layer 3 as a mask for processing the film to be processed 2 in terms of processing. Hereinafter, an example is described, in which the tri-layer resist process is adopted for the antireflection film. The bottom layer 3 was formed as follows: for example, a chemical solution HM8005 (made by JSR Corp.) was coated by a spin coating method so as to have a thickness of 200 nm; and then a polymer was crosslinked by a heat treatment.

Subsequently, the middle layer (middle layer film) 4, containing carbon (C) and silicon (Si) as main components, was formed over the bottom layer 3. The middle layer 4 was formed by using SHB-A759 (made by Shin-Etsu Chemical Co., Ltd.) as a base material (base resin). After the material was coated by a spin coating method so as to have a thickness of 80 nm, the base polymer was crosslinked by a heat treatment at 180° C. for 90 seconds, thereby allowing the middle layer 4 to be formed.

Subsequently, the resist layer (photosensitive resist layer, top-coatless resist layer, resist film) PR is formed by spin coating a top-coatless resist (Step S3 in FIG. 3.) The coating was followed by thermal curing. The resist layer PR is formed by using a chemically amplified positive resist. A methacrylate resin, to which a 2-methyl adamantyl group was bonded, the 2-methyl adamantyl group being detached when sympathizing with an acid, was used as a base polymer of the resist layer PR (addition amount: 7.0 mass % based on the total mass); and triphenylsulfonium nonaflate was used as PAG (addition amount: 5.0 mass % based on the total mass of the base polymer.) Triethanolamine was used as a quencher (addition amount: 5.0 mass % based on the mass of the base polymer); and a fluorine compound insoluble in an alkali developer was used as a water-repellent additive (addition amount: 4.0 mass % based on the mass of the base polymer.) The material of the resist layer PR is made by dissolving these materials (the aforementioned base polymer, PAG, quencher, and water-repellent additive) in PGMEA (propylene glycol monomethyl ether acetate) that was used as a solvent. The resist layer PR was coated by a spin coating method so as to have a thickness of 100 nm followed by a heat treatment at 100° C. for 60 seconds. The water-repellent additive added to the resist layer PR was surface-segregated during the spin coating, and as a result, the resist layer PR exhibited a high water-repellent property in which the receding contact angle of the resist layer PR was 75.0.

Figure 5:
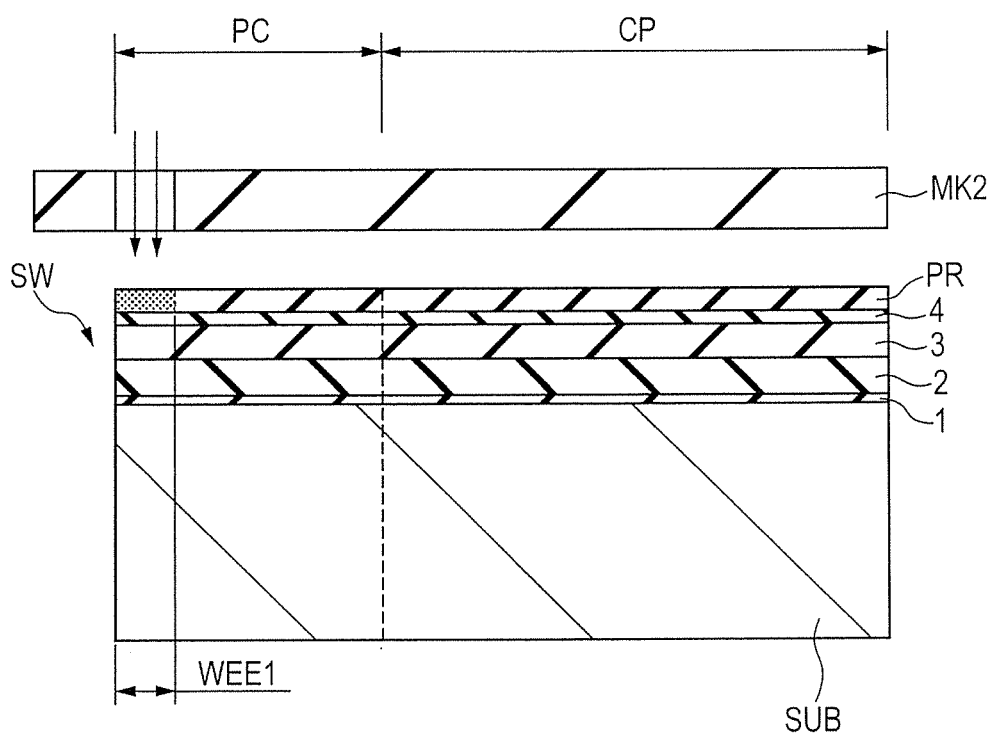
FIG. 5 is an essential-part sectional view illustrating a manufacturing step of a semiconductor device, following FIG. 4.

Subsequently, in order to lower the water-repellent property of the resist layer PR, first wafer edge exposure is performed in a region (outer peripheral region) near to the outer periphery WF of the semiconductor wafer SW, as illustrated in FIG. 5 (Step S4 in FIG. 3.) In the first wafer edge exposure, a region having a first width (e.g., 1 mm) from the outer periphery WF of the semiconductor wafer SW is selectively irradiated with exposure light by using a photomask MK2, as illustrated in FIGS. 5 and 15. The region irradiated with exposure light is the first wafer edge exposure region WEE1. As illustrated in FIG. 15, the first wafer edge exposure region WEE1 is a region between the outer periphery WF and a first wafer edge exposure region inner periphery W1. In the first wafer edge exposure, it is preferable to employ dry exposure using DUV (Deep Ultraviolet) light having a wavelength longer than that of the light used in the liquid immersion exposure in order to reduce processing time and cost.

In the first wafer edge exposure, when the resist layer PR was irradiated, for example, at a light exposure of 100 mJ/cm$^2$, with exposure light having a wavelength of 200 nm emitted from a mercury xenon lamp, an acid was generated from a photo-acid generating agent in the chemically amplified positive resist, and the generated acid caused the deprotection reaction of the base resin of the resist to partially progress, so that a polar group appeared in the base resin. As a result, the receding contact angle of the surface of the resist layer PR in the first wafer edge exposure region WEE1 was lowered to 72.0. That is, the water-repellent property of the resist layer PR in the first wafer edge exposure region WEE1 was lowered by the first wafer edge exposure.

Figure 6:
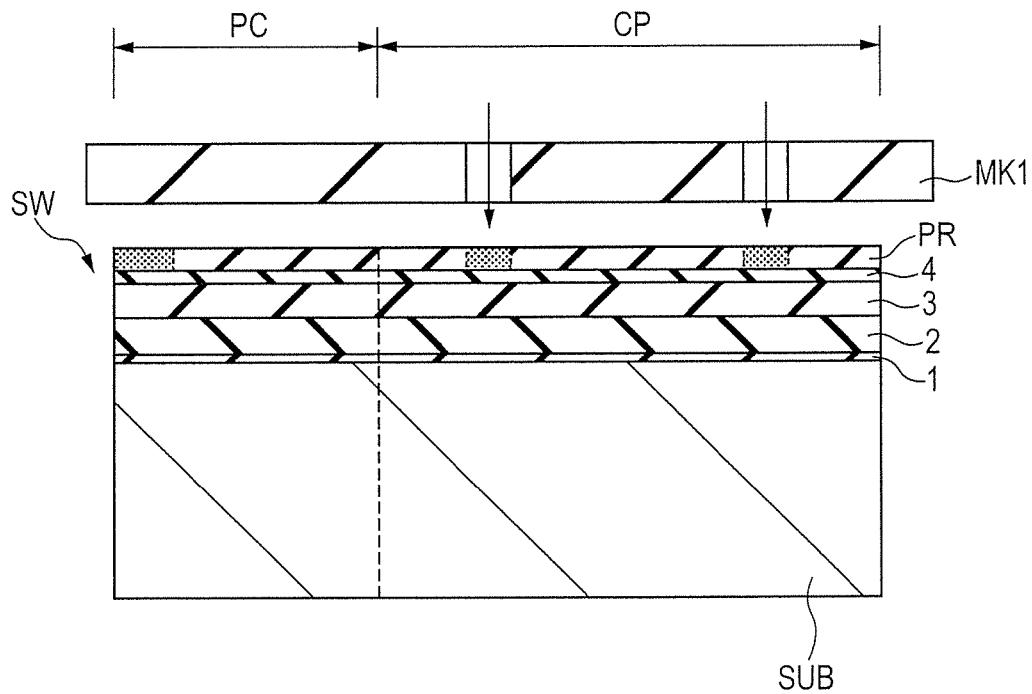
FIG. 6 is an essential-part sectional view illustrating a manufacturing step of a semiconductor device, following FIG. 5.

Subsequently, liquid immersion exposure is performed, as illustrated in FIGS. 6 and 15 (Step S5 in FIG. 3.) Liquid immersion exposure is performed on the resist layer PR formed over the main surface of the semiconductor wafer SW, as described with reference to FIGS. 1 and 2. In the liquid immersion exposure, the pattern formed in the photomask (reticle) MK1 is imaged over the resist layer PR by reduced projection exposure, and the light exposure of exposure light having a wavelength of 193 nm was set to 20 mJ/cm$^2$. The liquid immersion exposure is scanning exposure in which chip regions CH are sequentially formed over the main surface of the semiconductor wafer SW by scanning the semiconductor wafer SW with respect to the lens LS. The chip regions CH are arranged over the main surface of the semiconductor wafer SW and in a matrix pattern in the vertical and horizontal directions, and they are also formed across the entire circumference of the outer periphery WF of the semiconductor wafer SW. That is, the outer periphery WF of the semiconductor wafer SW is located inside the chip regions CH arranged in a matrix pattern (in other words, inside a liquid immersion exposure region IL.) Because the liquid immersion exposure is performed on the outer periphery WF of the semiconductor wafer SW, the aforementioned problems regarding the bubble VD are caused. Incidentally, the reason why the chip regions CH are formed also across the outer periphery WF of the semiconductor wafer SW is that processing accuracy and yield are improved by matching the environments of processing, such as exposure, etching, or the like, for both the chip regions CH located in the central portion CP of the semiconductor wafer SW and those located in the peripheral portion PC. Also, it is because the number of the chip regions CH over the semiconductor wafer SW is increased.

FIG. 6 illustrates an example in which only a partial portion of the central portion CP of the semiconductor wafer SW is irradiated with the exposure light in the liquid immersion exposure.

Figure 7:
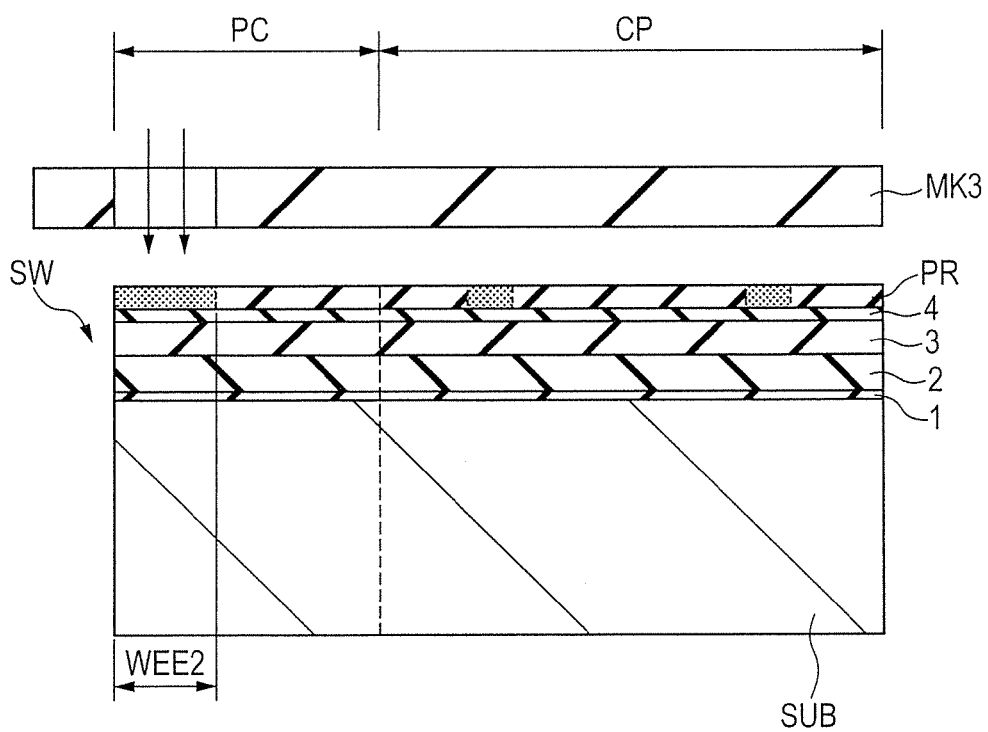
FIG. 7 is an essential-part sectional view illustrating a manufacturing step of a semiconductor device, following FIG. 6.

Subsequently, second wafer edge exposure is performed in the outer periphery of the semiconductor wafer SW, as illustrated in FIG. 7 (Step S6 in FIG. 3.) In the second wafer edge exposure, a region having a second width (e.g., 1.5 mm) from the outer periphery WF of the semiconductor wafer SW is selectively irradiated with exposure light by using a photomask MK3, as illustrated in FIGS. 7 and 15. The region irradiated with exposure light is the second wafer edge exposure region WEE2. As illustrated in FIG. 15, the second wafer edge exposure region WEE2 is a region between the outer periphery WF and a second wafer edge exposure region inner periphery W2. In the second wafer edge exposure, it is preferable to employ dry exposure using DUV light having a wavelength longer than that of the light used in the liquid immersion exposure in order to reduce processing time and cost.

The second wafer edge exposure is performed in order to remove, in the later-described developing step, the resist layer PR in an area near to the outer periphery WF of the semiconductor wafer SW. The thickness of the resist layer PR in the area near to the outer periphery WF of the semiconductor wafer SW is more likely to vary in comparison with the central portion CP. This is because the circumference of the semiconductor wafer SW is chamfered in the thickness direction, or because the resist layer PR is coated by a spin coating method, or the like. The variation in the film thickness causes a pattern defect of the film to be processed 2 in the area near to the outer periphery WF of the semiconductor wafer SW. The second wafer edge exposure is performed in order to remove the resist layer PR in a region where a variation in the thickness of the resist layer PR is to be caused.

It is important that the second wafer edge exposure region inner periphery W2 is located more inside the main surface of the semiconductor wafer SW (located nearer to the center) than the first wafer edge exposure region inner periphery W1. That is, an influence of the exposure light in the first wafer edge exposure, which may be affected on the chip regions CH formed inside the second wafer edge exposure region inner periphery W2 (formed near to the center), can be prevented (reduced) by separating the second wafer edge exposure region inner periphery W2 from the first wafer edge exposure region inner periphery W1. The second wafer edge exposure region inner periphery W2 may be set at a distance of 2 mm from the outer periphery WF. In the second wafer edge exposure, the resist layer PR is irradiated, for example, at a light exposure of 60 mJ/cm$^2$, with exposure light emitted from a mercury xenon lamp, Subsequently, PEB (Post Exposure Bake) is performed on the resist layer PR under conditions, for example, at 100° C. for 60 seconds. Because of the aforementioned first wafer edge exposure, liquid immersion exposure, and second wafer edge exposure, an acid is generated from the acid generating agent contained in the resist layer PR in the region irradiated with the exposure light (ultraviolet light). Further, a deprotection reaction is caused to progress in the resist layer PR in the irradiated region by performing the PEB. That is, the acid generated in the irradiated region acts on an alkali dissolution inhibiting group of the base resin, the alkali dissolution inhibiting group being acid-dissociable, so that the base resin is decomposed, which changes the resist layer PR so as to have a molecular structure dissoluble in an alkali developer.

Figure 8:
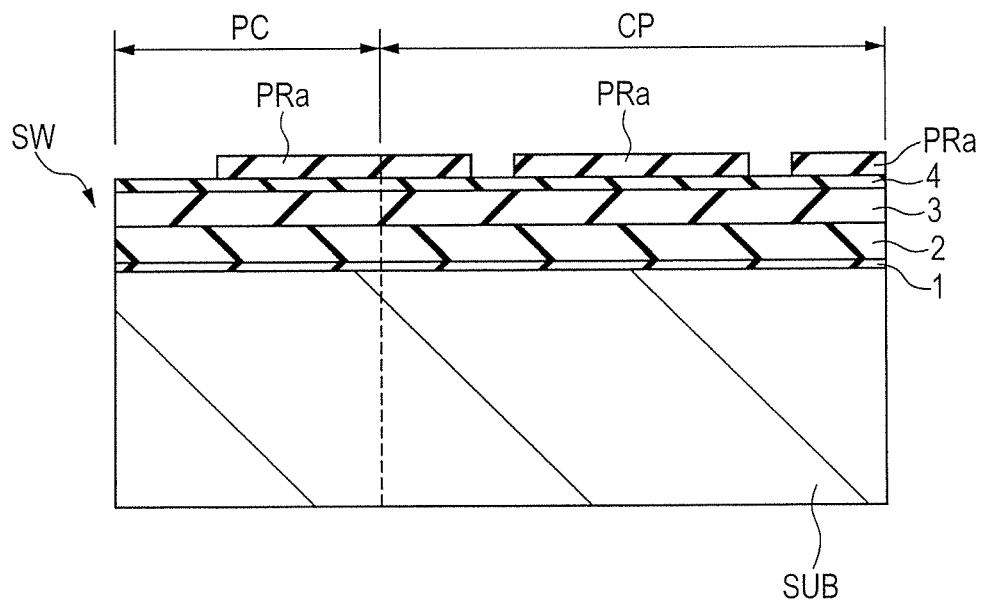
FIG. 8 is an essential-part sectional view illustrating a manufacturing step of a semiconductor device, following FIG. 7.

Subsequently, development is performed on the semiconductor wafer SW, as illustrated in FIG. 8 (Step S7 in FIG. 3.) An alkaline tetramethylammonium hydroxide liquid (hereinafter, referred to as a TMAH liquid), or the like, is used as a developer, and the development is performed for 30 seconds. The resist layer PR in the region irradiated with exposure light is dissolved by the development, so that a resist pattern PRa is completed and the middle layer 4 is exposed from an opening that is a dissolved area of the resist layer PR. In the liquid immersion exposure, the resist layer PR in each of the region irradiated with ArF excimer laser exposure light and the second wafer edge exposure region WEE2 is removed.

As a result of the inspection of the resist pattern PRa obtained when the development is completed, it has been found that pattern defects are reduced in comparison with the state before the first wafer edge exposure is performed. That is, by performing the first wafer edge exposure on the resist layer PR of the semiconductor wafer SW before the liquid immersion exposure, the water-repellent property of the resist layer PR in the first wafer edge exposure region WEE1 can be lowered and the engulfment of a bubble can be prevented during the liquid immersion exposure, thereby allowing a pattern defect of the resist pattern PRa to be prevented.

Figure 9:
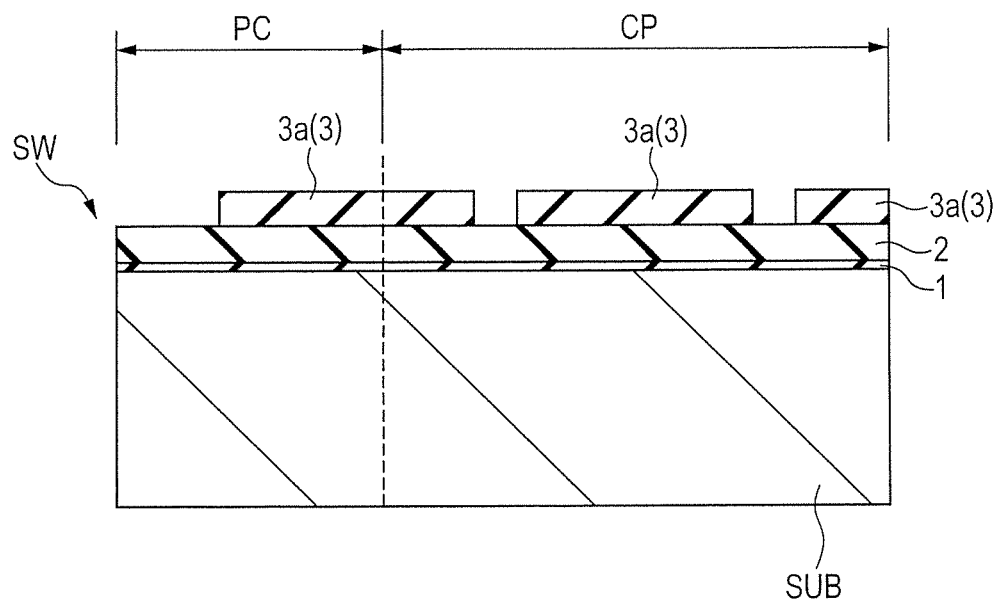
FIG. 9 is an essential-part sectional view illustrating a manufacturing step of a semiconductor device, following FIG. 8.

Subsequently, the middle layer 4 and the bottom layer 3 are etched, as illustrated in FIG. 9 (Step S8 in FIG. 3.) The middle layer 4 was dry etched by using mixed gas of $CHF_3$, $CF_4$, and $O_2$ with the use of the resist pattern PRa as a mask, thereby allowing the pattern of the resist pattern PRa to be transferred to the middle layer 4. Further, the bottom layer 3 is dry etched by using mixed gas of $O_2$, $N_2$, and HBr with the use of the pattern formed by the resist pattern PRa and the middle layer 4 as a mask, thereby allowing a bottom layer pattern 3a, to which the pattern of the resist pattern PRa has been transferred, to be completed. During the etching of the bottom layer 3, the resist pattern PRa and the middle layer 4 are removed and disappear.

Figure 10:
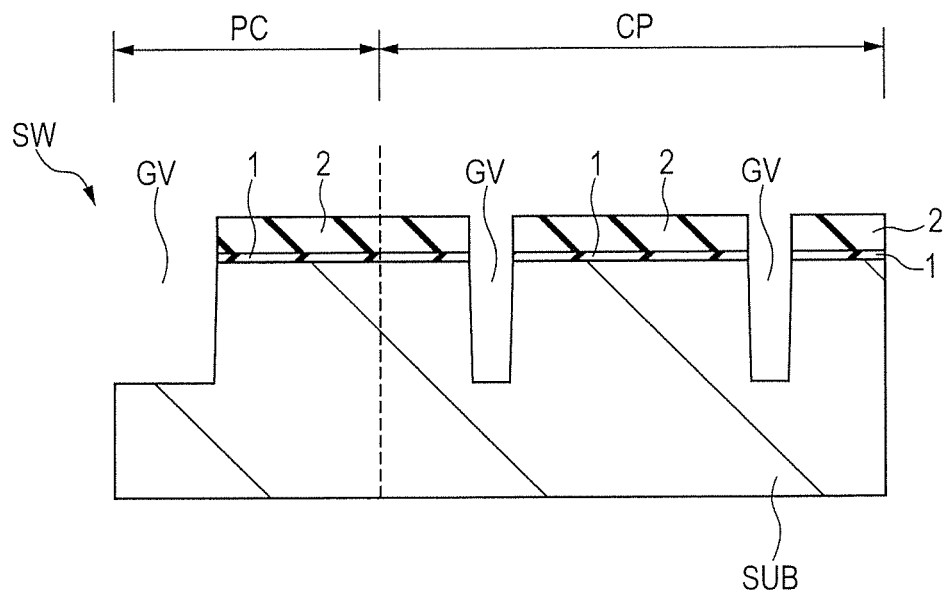
FIG. 10 is an essential-part sectional view illustrating a manufacturing step of a semiconductor device, following FIG. 9.

Subsequently, the film to be processed 2 is etched by using the bottom layer pattern 3a as a mask and a trench GV is formed, as illustrated in FIG. 10 (Step S9 in FIG. 3.) In this step, the silicon nitride film that is the film to be processed 2, the insulating film 1, and the semiconductor substrate (silicon substrate) SUB are sequentially dry etched by using mixed gas of Cl, HBr, $SF_6$, and $O_2$. Because the resist pattern PRa of the resist layer PR is transferred to the film to be processed 2 and the trench GV is formed in the semiconductor substrate SUB by using the film to be processed 2 as a mask, the trench GV is formed at a position corresponding to the opening of the resist pattern PRa.

Figure 11:
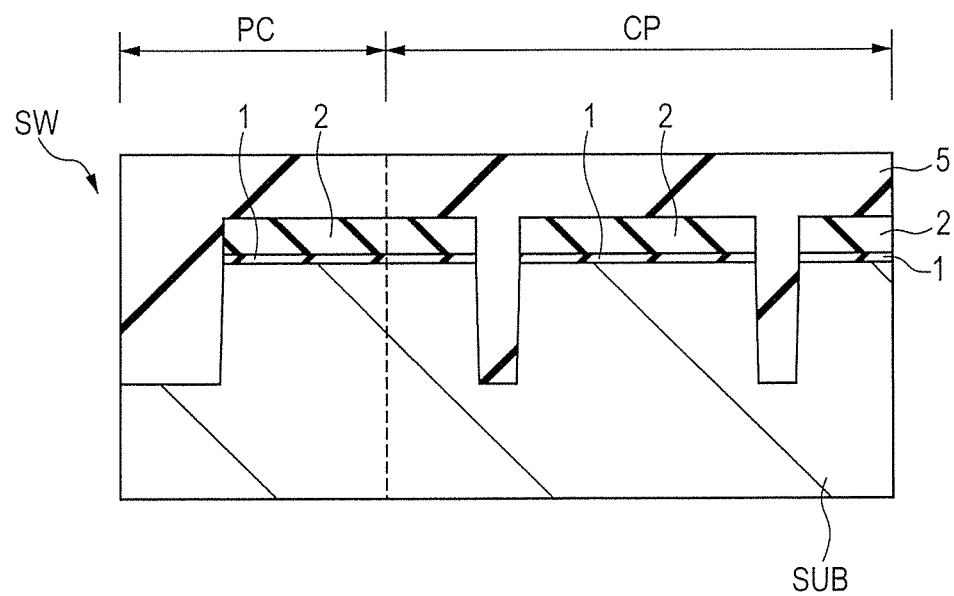
FIG. 11 is an essential-part sectional view illustrating a manufacturing step of a semiconductor device, following FIG. 10.

Subsequently, an element isolation insulating film 5 including, for example, a silicon oxide film is deposited over the semiconductor substrate SUB by a CVD (Chemical Vapor Deposition) method, so that the trench GV is filled with the element isolation insulating film 5, as illustrated in FIG. 11.

Figure 12:
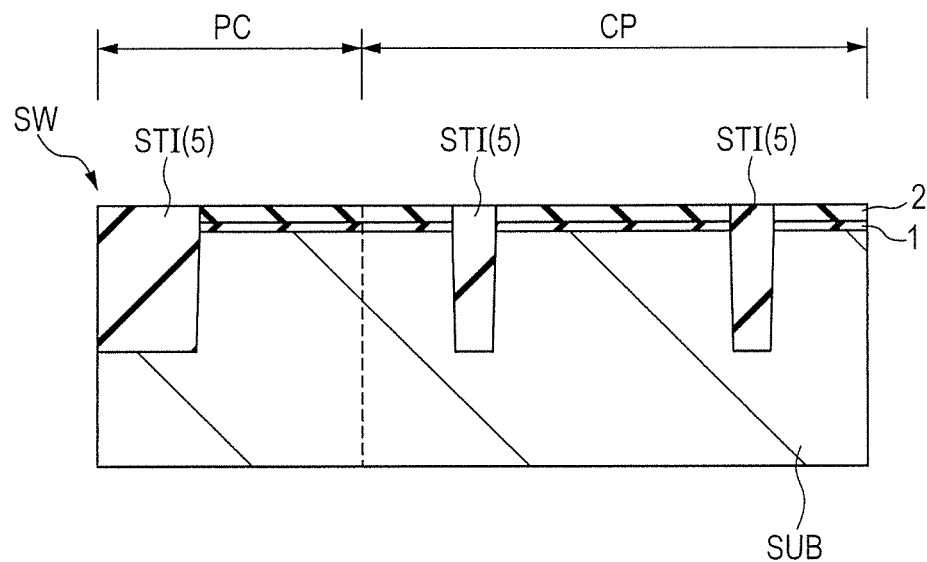
FIG. 12 is an essential-part sectional view illustrating a manufacturing step of a semiconductor device, following FIG. 11.

Subsequently, the element isolation insulating film 5 is selectively left only in the trench GV by performing CMP (Chemical Mechanical Polishing) processing on the element isolation insulating film 5, thereby allowing an element isolation region STI to be formed, as illustrated in FIG. 12 (Step S10 in FIG. 3.)

Figure 13:
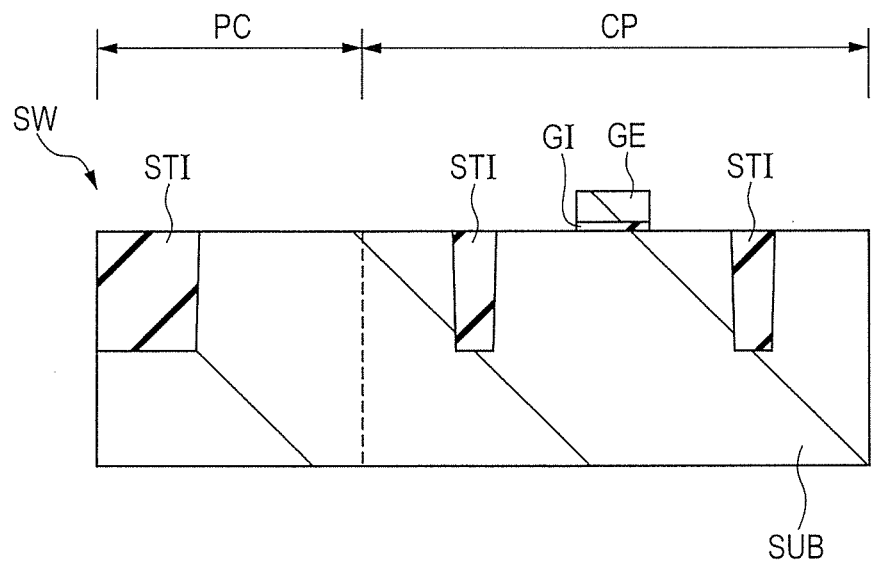
FIG. 13 is an essential-part sectional view illustrating a manufacturing step of a semiconductor device, following FIG. 12.

Subsequently, the film to be processed 2 and the insulating film 1 are removed, and then a gate insulating film GI and a gate electrode GE are formed over the main surface of the semiconductor substrate SUB, as illustrated in FIG. 13.

When the film to be processed 2 and the insulating film 1 are removed after the element isolation region STI is formed, an active region surrounded, in plan view, by the element isolation region STI is formed over the main surface of the semiconductor substrate SUB. Subsequently, an insulating film to become the gate insulating film GI and a conductor film to become the gate electrode GE are formed over the main surface of the semiconductor substrate SUB. Then, the gate electrode GE and the gate insulating film GI are formed by etching the conductor film and the insulating film. The gate electrode GE can be formed by performing Step S3 to Step S9 in FIG. 3 with the use of the conductor film as the aforementioned film to be processed. The gate insulating film GI can be formed by a silicon oxide film, a silicon oxynitride film, or the like. On the other hand, the gate electrode GE can be formed by a polycrystalline silicon film, a metal film, or the like.

Alternatively, the conductor film may be caused to correspond to the semiconductor substrate SUB. In that case, the etching step of forming the trench GV in the semiconductor substrate SUB corresponds to the step of etching the conductor film in order to form the gate electrode GE.

Figure 14:
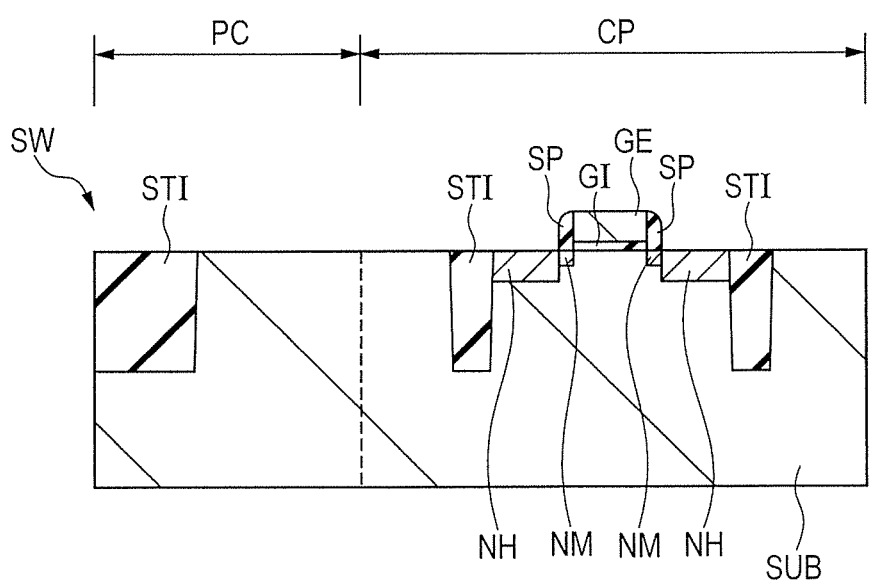
FIG. 14 is an essential-part sectional view illustrating a manufacturing step of a semiconductor device, following FIG. 13.
Figure 15:
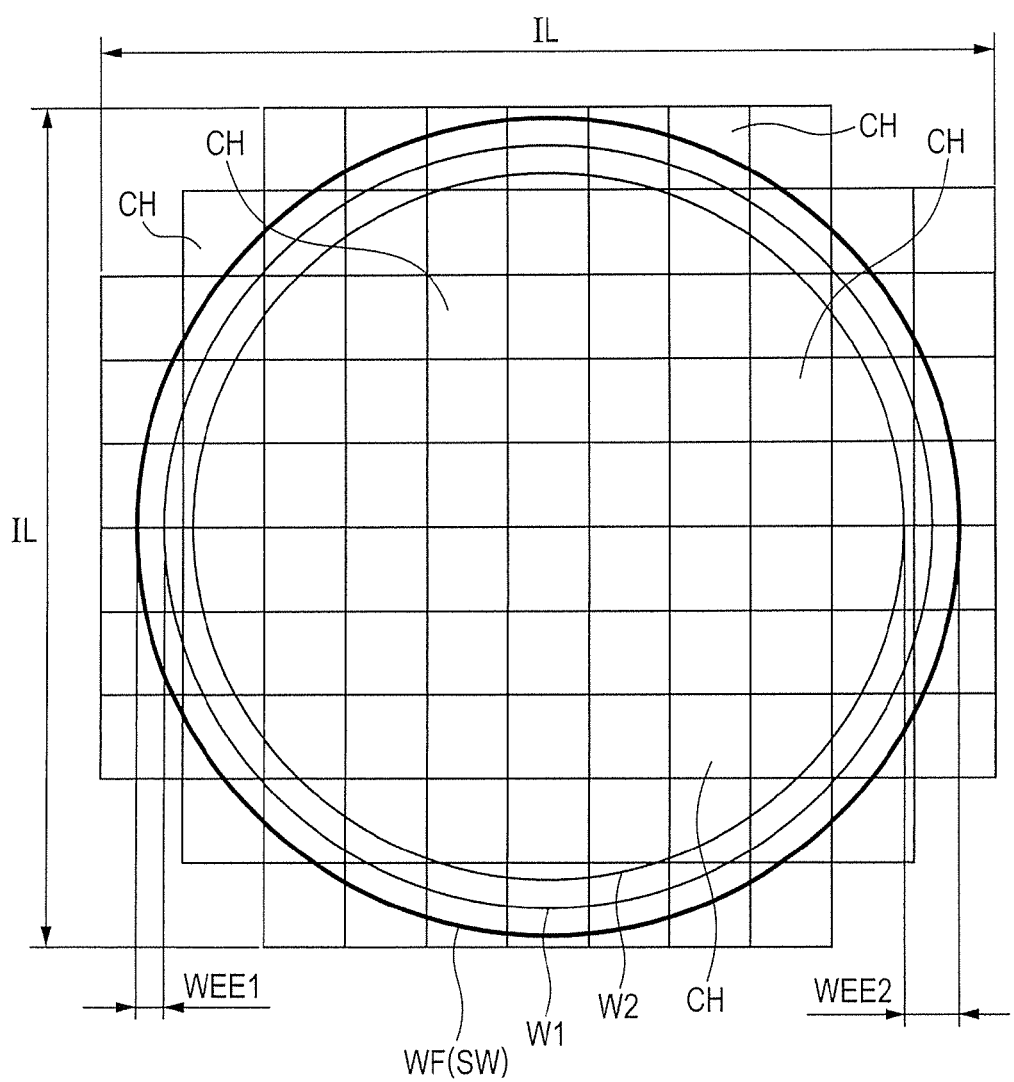
FIG. 15 is a plan view of a semiconductor wafer, illustrating an exposure region.

Subsequently, a low-concentration semiconductor region NM, a sidewall insulating film SP, and a high-concentration semiconductor region NH are sequentially formed, as illustrated in FIG. 14. The low-concentration semiconductor region NM is first formed over the surface of the semiconductor substrate SUB at both the ends of the gate electrode GE. The low-concentration semiconductor region NM is, for example, an n-type semiconductor region, and is formed by ion-implanting impurities, such as phosphorus (P), arsenic (As), or the like, in a self-aligned manner to the gate electrode GE.

Subsequently, the sidewall insulating film SP can be selectively formed over the sidewall of the gate electrode GE by depositing an insulating film so as to cover the upper surface and the side surface of the gate electrode GE and then by performing anisotropic dry etching on the insulating film. The sidewall insulating film SP may include a silicon oxide film, a silicon nitride film, or a laminated structure of the two.

Subsequently, the high-concentration semiconductor region NH is formed over the surface of the semiconductor substrate SUB at both the ends of the gate electrode GE. The high-concentration semiconductor region NH is, for example, an n-type semiconductor region, and is formed by ion-implanting impurities, such as phosphorus (P), arsenic (As), or the like, in a self-aligned manner with respect to the gate electrode GE and the sidewall insulating film SP.

The MISFET is formed by the gate electrode GE, the gate insulating film GI, the low-concentration semiconductor region NM, and the high-concentration semiconductor region NH. The source and drain of the MISFET are formed by the low-concentration semiconductor region NM and the high-concentration semiconductor region NH.

According to the present embodiment, the water-repellent property of the resist layer PR to be used in liquid immersion exposure, the resist layer PR being present in the first wafer edge exposure region WEE1 located in the periphery of the semiconductor wafer SW, is lowered by performing first wafer edge exposure on the resist layer PR before the liquid immersion exposure, thereby allowing the engulfment of the bubble VD to be prevented and a pattern defect of the resist pattern PRa to be prevented in the liquid immersion exposure.

Further, a pattern defect of each of a silicon nitride film, which is the film to be processed 2 to which the pattern of the resist pattern PRa has been transferred, and the element isolation region STI can be prevented, thereby allowing a semiconductor device with high reliability to be provided. Furthermore, the manufacturing yield of a semiconductor device can be improved.

If the engulfment of the bubble VD is noticeable, the light exposure in the first wafer edge exposure is increased. Thereby, the hydrophilic property of the first wafer edge exposure region WEE1 can be increased to a higher level, so that the engulfment of the bubble VD can be suppressed. If water leak is caused in the gap GP by performing the first wafer edge exposure, the light exposure in the first wafer edge exposure is reduced. Thereby, the excessive hydrophilic property of the resist surface, which may be caused by performing the first wafer edge exposure, can be improved. As described above, the light exposure in the first wafer edge exposure can be easily changed by performing the first wafer edge exposure and the second wafer edge exposure in different steps, thereby allowing the engulfment of the bubble VD, which may be caused during liquid immersion exposure, to be prevented.

By making the width of the second wafer edge exposure region WEE2 larger than that of the first wafer edge exposure region WEE1, the exposure light, with which the first wafer edge exposure region WEE1 is irradiated, never adversely affects the chip region CH formed inside the second wafer edge exposure region WEE2 (formed inside (near to the center of) the second wafer edge exposure region inner periphery W2), even when the light exposure in the first wafer edge exposure is changed. Accordingly, the light exposure in the first wafer edge exposure can be increased sufficiently, and hence the water-repellent property of the resist layer PR can be lowered sufficiently.

By making the wavelength of the exposure light in the first wafer edge exposure longer than that of the exposure light in liquid immersion exposure, an exposure apparatus using, for example, DUV light can be adopted for the first wafer edge exposure, and hence both the processing time of the first wafer edge exposure and manufacturing cost can be reduced. Because an exposure apparatus using DUV light can also be adopted for the second wafer edge exposure, similar effects can be obtained.

Further, a pattern defect in the gate electrode GE, to which a similar manufacturing method has been applied, can be prevented.

<First Variation>

In First Variation, the surface of the semiconductor wafer SW (resist layer PR) is subjected to a washing treatment by deionized water immediately after the first wafer edge exposure of Step S4 in FIG. 3.

In the resist layer PR in the first wafer edge exposure region WEE1, the deprotection reaction of the base resin that forms the resist layer PR partially progresses immediately after the first wafer edge exposure, so that a polar group appears. Because the polar group has a high affinity with water, the orientation thereof is changed in a direction toward the surface of the resist layer PR when water is supplied to the surface thereof, thereby allowing the hydrophilic property of the resist layer PR to be improved.

The aforementioned washing treatment is effective particularly when the water-repellent property of the resist layer PR cannot be sufficiently lowered in the first wafer edge exposure, and the like.

<Second Variation>

In Second Variation, a heat treatment is performed on the semiconductor wafer SW immediately after the first wafer edge exposure of Step S4 in FIG. 3. It is preferable that the heat treatment is performed under the conditions at 70° C. for approximately 10 seconds, the temperature and time being set to be lower and shorter than the conditions of the PEB.

By performing the heat treatment immediately after the first wafer edge exposure, the deprotection reaction of the resist layer PR in the first wafer edge exposure region WEE1 can be caused to progress to a further level, so that the water-repellent property is greatly lowered. Similarly to the case of First Variation, the heat treatment is effective particularly when the water-repellent property of the resist layer PR cannot be sufficiently lowered in the first wafer edge exposure, and the like.

<Third Variation>

In Third Variation, the second wafer edge exposure is performed before the liquid immersion exposure in the process flow in FIG. 3. Either the first wafer edge exposure or the second wafer edge exposure may be performed first as long as they are performed before the liquid immersion exposure, but it is important to perform both of them. Exposure conditions are the same as those in the aforementioned embodiment, and the first wafer edge exposure and the second wafer edge exposure are performed on different regions and under different conditions, respectively. That is, it is important to make the width of the second wafer edge exposure region WEE2 larger than that of the first wafer edge exposure region WEE1 for controlling the water-repellent property. By maintaining this relationship, the chip region CH formed inside the second wafer edge exposure region WEE2 (formed inside (near to the center of) the second wafer edge exposure region inner periphery W2) cannot be adversely affected by the exposure light in the first wafer edge exposure. For example, when the light exposure of the exposure light in the second wafer edge exposure is increased, the first wafer edge exposure can be omitted; however, the chip region inside the second wafer edge exposure region inner periphery W2 in FIG. 15 is affected, and hence it is preferable to perform the first wafer edge exposure and the second wafer edge exposure together.

In Third Variation, the first wafer edge exposure and the second wafer edge exposure can be performed in a single exposure apparatus unit, and hence the processing time of the exposure steps can be reduced. In the aforementioned embodiment, it is common that the first wafer edge exposure, the liquid immersion exposure, and the second wafer edge exposure are performed in exposure apparatus units different from each other. In Third Variation, the first wafer edge exposure and the second wafer edge exposure can be performed in a single exposure apparatus unit, and hence both the time for transfers among units and throughput can be reduced.

A semiconductor device according to the present embodiment can be thus manufactured.

The invention made by the present inventors has been specifically described above based on its preferred embodiments, but it is needless to say that the invention should not be limited to the embodiments and may be modified variously within a range not departing from the gist thereof.

The present invention has been described by using an example in which, for example, the resist layer PR is formed over the film to be processed 2 via the bottom layer 3 and the middle layer 4, but the middle layer 4, the bottom layer 3, or both of the two may be omitted.

What is claimed is:

1. A manufacturing method of a semiconductor device, comprising steps of:
    (a) providing a semiconductor substrate whose outer periphery is approximately circular;
    (b) forming a first insulating film over the semiconductor substrate;
    (c) forming a resist layer over the first insulating film;
    (d) irradiating first exposure light to a part of the resist layer which is located in a region having a first width from the outer periphery of the semiconductor substrate;
    (e) irradiating third exposure light to a part of the resist layer which is located in a region having a second width being larger than the first width from the outer periphery of the semiconductor substrate;
    (f) after the steps (d) and (e), performing liquid immersion exposure in which the resist layer is irradiated with second exposure light;
    (g) after the step (f), forming a resist pattern including a first pattern by removing the resist layer located in a region irradiated with the second exposure light and the third exposure light;
    (h) after the step (g), etching the first insulating film such that the first insulating film has the first pattern;
    (i) after the step (h), forming a trench in the semiconductor substrate by using the first pattern as a mask;
    (j) after the step (i), forming a second insulating film over the semiconductor substrate including inside of the trench; and
    (k) after the step (j), polishing the second insulating film by CMP method, thereby the second insulating film being outside of the trench is removed and the second insulating film being inside of the trench is kept.

2. A manufacturing method of a semiconductor device according to the claim 1,
    wherein the steps (d) and (e) are continuously performed in a single exposure apparatus unit.

3. A manufacturing method of a semiconductor device according to the claim 2,
    wherein a wavelength of the first exposure light is longer than that of the second exposure light.

4. A manufacturing method of a semiconductor device according to the claim 1,
    wherein the resist layer is a top-coatless resist.

5. A manufacturing method of a semiconductor device according to the claim 4,
    wherein the liquid immersion exposure is performed in a state where an immersion liquid is held between a lens and the resist layer and while the semiconductor substrate is scanning with respect to the lens.

6. A manufacturing method of a semiconductor device according to the claim 5,
    wherein in the step (f), the liquid immersion exposure is performed in a state where: a wafer stage guide is arranged to surround a circumference of the semiconductor substrate and at a position spaced apart by a predetermined distance from the outer periphery of the semiconductor substrate; and the immersion liquid lies across the wafer stage guide and the semiconductor substrate.

7. A manufacturing method of a semiconductor device according to the claim 1,
    wherein the first insulating film includes a silicon nitride film, and
    wherein the second insulating film includes a silicon oxide film.

8. A manufacturing method of a semiconductor device according to the claim 7, further comprising steps of:
    (l) after the step (k), removing the first insulating film,
    (m) after the step (l), forming a gate insulating film over the semiconductor substrate, and
    (n) after the step (m), forming a gate electrode over the gate insulating film.

* * * * *